United States Patent
Ho et al.

(10) Patent No.: US 7,993,997 B2
(45) Date of Patent: Aug. 9, 2011

(54) POLY PROFILE ENGINEERING TO MODULATE SPACER INDUCED STRESS FOR DEVICE ENHANCEMENT

(75) Inventors: Vincent Ho, Singapore (SG); Wenhe Lin, Singapore (SG); Young Way Teh, Singapore (SG); Yong Kong Siew, Selangor (MY); Bei Chao Zhang, Singapore (SG); Fan Zhang, Singapore (SG); Haifeng Sheng, Singapore (SG); Juan Boon Tan, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 207 days.

(21) Appl. No.: 11/865,563

(22) Filed: Oct. 1, 2007

(65) Prior Publication Data

US 2009/0085122 A1 Apr. 2, 2009

(51) Int. Cl.
*H01L 21/8238* (2006.01)
*H01L 21/336* (2006.01)

(52) U.S. Cl. ........ 438/199; 438/303; 438/305; 438/308; 257/204; 257/369; 257/E21.632

(58) Field of Classification Search .................. 438/197, 438/199, 301, 303, 305, 306, 308; 257/204, 257/369, 401, E21.632
See application file for complete search history.

(56) References Cited

U.S. PATENT DOCUMENTS

| | | | |
|---|---|---|---|
| 6,835,610 B2* | 12/2004 | Sayama et al. | 438/197 |
| 6,975,006 B2 | 12/2005 | Huang et al. | |
| 7,132,704 B2 | 11/2006 | Grudowski | |
| 7,473,593 B2* | 1/2009 | Anderson et al. | 438/197 |
| 7,518,188 B2* | 4/2009 | Shima et al. | 257/347 |
| 7,649,232 B2* | 1/2010 | Tamura et al. | 257/383 |
| 2007/0158763 A1* | 7/2007 | Anderson et al. | 257/401 |

OTHER PUBLICATIONS

X. Cheng et al., "Stress Proximity Technique for Performance Improvement With Dual Stress Liner at 45nm Technology and Beyond", 2006 Symposium on VLSI Technology Digest of Technical Papers, pp. 60-61, Jun. 13-15, 2006.
Ch. H. Chen et al., "Stress Memorization Technique (SMT) by Selectively Strained-Nitride Capping for Sub-65nm High-Performance Strained-Si Device Application", 2006 Symposium on VLSI Technology Digest of Technical Papers, pp. 56-57, Jun. 15-17, 2004.
T. Ueno et al., "Dramatically Enhanced Performance of Recessed SiGe Source-Drain PMOS by In-Situ Etch and Regrowth Technique (InSERT)", 2006 Symposium on VLSI Technology Digest of Technical Papers, pp. 24-25, Jun. 14-16, 2005.
S. Yang et al., "Dual Stress Line for High Performance Sub-45nm Gate Length SOI CMOS Manufacturing", Electron Devices Meeting, 2004. IEDM Technical Digest, IEEE International, pp. 1075-1078, Dec. 13-15, 2004.

* cited by examiner

*Primary Examiner* — Hsien-ming Lee
(74) *Attorney, Agent, or Firm* — Horizon IP Pte. Ltd.

(57) ABSTRACT

The present invention provides a method of inducing stress in a semiconductor device substrate by applying an ion implantation to a gate region before a source/drain annealing process. The source/drain region may then be annealed along with the gate which will cause the gate to expand in certain areas due to said ion implantation. As a result, stress caused by said expansion of the gate is transferred to the channel region in the semiconductor substrate.

24 Claims, 8 Drawing Sheets

POLY PROFILE ENGINEERING TO MODULATE SPACER INDUCED STRESS FOR DEVICE ENHANCEMENT

BACKGROUND OF THE INVENTION

The present invention relates to a method of fabricating semiconductor structures and, more particularly, to a method of enhancing semiconductor device performance by modulating spacer induced stress.

Minimum feature sizes of CMOS semiconductor devices are continuously being reduced. To overcome limitations of the scaling of CMOS devices various techniques have been developed to enhance carrier mobility. One such technique is to induce stress in the channel region to enhance carrier mobility. Various ways to induce stress in the channel region have been developed including: stress engineering through local strain techniques such as dual stress liners (DSL), and stress proximity technique (SPT); process induced strain methods such as stress memorization technique (SMT); and recessed SiGe source/drain for PMOS.

The SPT and DSL techniques have been demonstrated to improve both NFET and PFET drive currents. The reduced proximity of stress liner due to the removal of the spacer before the DSL process maximizes the strain transfer from nitride liner to the channel.

In the SMT process, the stress effect from the highly tensile nitride cap layer is enhanced and memorized by well-controlled poly gate amorphization and re-crystallization steps.

U.S. Pat. No. 6,975,006 to Huang et al. discloses the use of recessed first and second recessed spacers situated on top of first and second poly gate sidewall liners respectively. The height of the originally formed spacers is reduced for the recessed spacers. Also, the width of the horizontal part of the sidewall liner is shorter than the width of the spacer. It is asserted that the reduced spacer height can reduce the device channel stress.

U.S. Pat. No. 7,132,704 to Grudowski discloses the use of a tensile nitride spacer to enhance the NFET device performance. The stress in the tensile nitride spacers film can be adjusted with selectively or non-selective implantation of xenon or germanium either before or after etching the spacer film.

One disadvantage with prior techniques for modulating stress induced in the channel region is that they are relatively complex. Another disadvantage is that there is currently no simple technique, to the inventors' knowledge, to separately modulate the stress on various devices of different threshold voltages, such as for low, regular and high threshold voltages (LVT, RVT and HVT respectively). Another disadvantage with prior stress modulating techniques is that they cannot always be used in combination with other such techniques.

As can be seen, there is a need for an improved method of modulating spacer induced stress for device enhancement. Further, there is a need for such a technique which is not complex and with can allow the separate modulation of stress on various devices of different threshold voltages. Also, there is a need for a stress modulation technique that can be used in combination with other stress modulation techniques.

SUMMARY OF THE INVENTION

In one aspect of the present invention, a method of processing a semiconductor device comprises forming a polysilicon film on a semiconductor substrate; forming a photo resist layer over a first predetermined region of the semiconductor substrate; forming a mask over the first predetermined region of the semiconductor substrate; ion implanting the polysilicon film over a second predetermined region of the semiconductor substrate, the second predetermined region being different from, and adjacent to, the first predetermined region; and annealing a gate formed on the implanted polysilicon film.

In another aspect of the present invention, a method of processing a semiconductor device comprises: forming a polysilicon film on a semiconductor substrate; forming a photo resist layer over a first predetermined region of the semiconductor substrate; forming a mask over the first predetermined region of the semiconductor substrate; ion implanting the polysilicon film over a second predetermined region of the semiconductor substrate, the second predetermined region being different from, and adjacent to, the first predetermined region; and annealing a gate formed on the implanted polysilicon film.

In accordance with a further aspect of the present invention, a transistor comprises: a semiconductor substrate; a source in the semiconductor substrate; a drain in the semiconductor substrate; and a gate on the semiconductor substrate, the gate having bulging sidewalls.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention may be advantageously used in semiconductor fabrication processes for producing devices having high carrier mobility. The present invention may also be advantageously used in CMOS device fabrication where it is desired to induce and modulate the stress in the channel region.

Embodiments of the present invention may provide a method to improve carrier mobility by modulating the stress in the channel region of a transistor. To accomplish this, the present invention may employ different Germanium (Ge) implant conditions to the poly gate, followed by subsequent source/drain anneal. As a result of this process, the shape of the poly gate may be changed, which induces stress on the adjacent spacer thereby inducing stress on the channel. Furthermore, using this method the spacer induced stress in the channel may be controlled for various devices on a wafer independently, for example for LVT, RVT and HVT devices. Another advantage is that the process can be relatively simple, as compared to other techniques for inducing channel stress. A further advantage is that the present invention can be incorporated and used together with various other stress enhancement techniques, such as SMT.

Prior art semiconductor fabrication methods for inducing channel stress were relatively complex and did not employ different Ge implant conditions to the poly gate, followed by subsequent source/drain annealing.

Figure 1A:
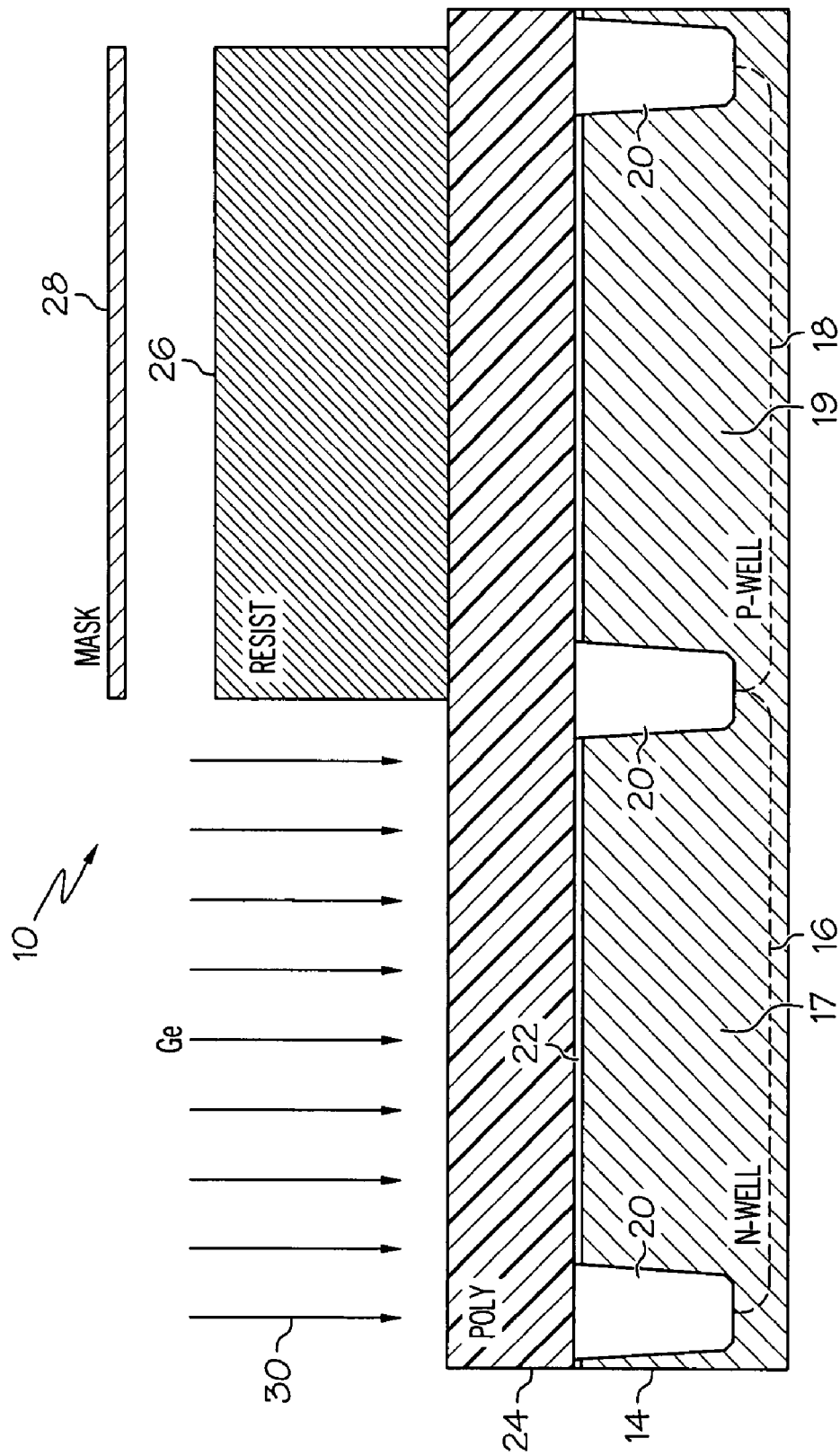
FIG. 1 shows a cross-sectional representation of a transistor fabricated according to a first embodiment of the stress modulating method of the present invention.
Figure 1B:
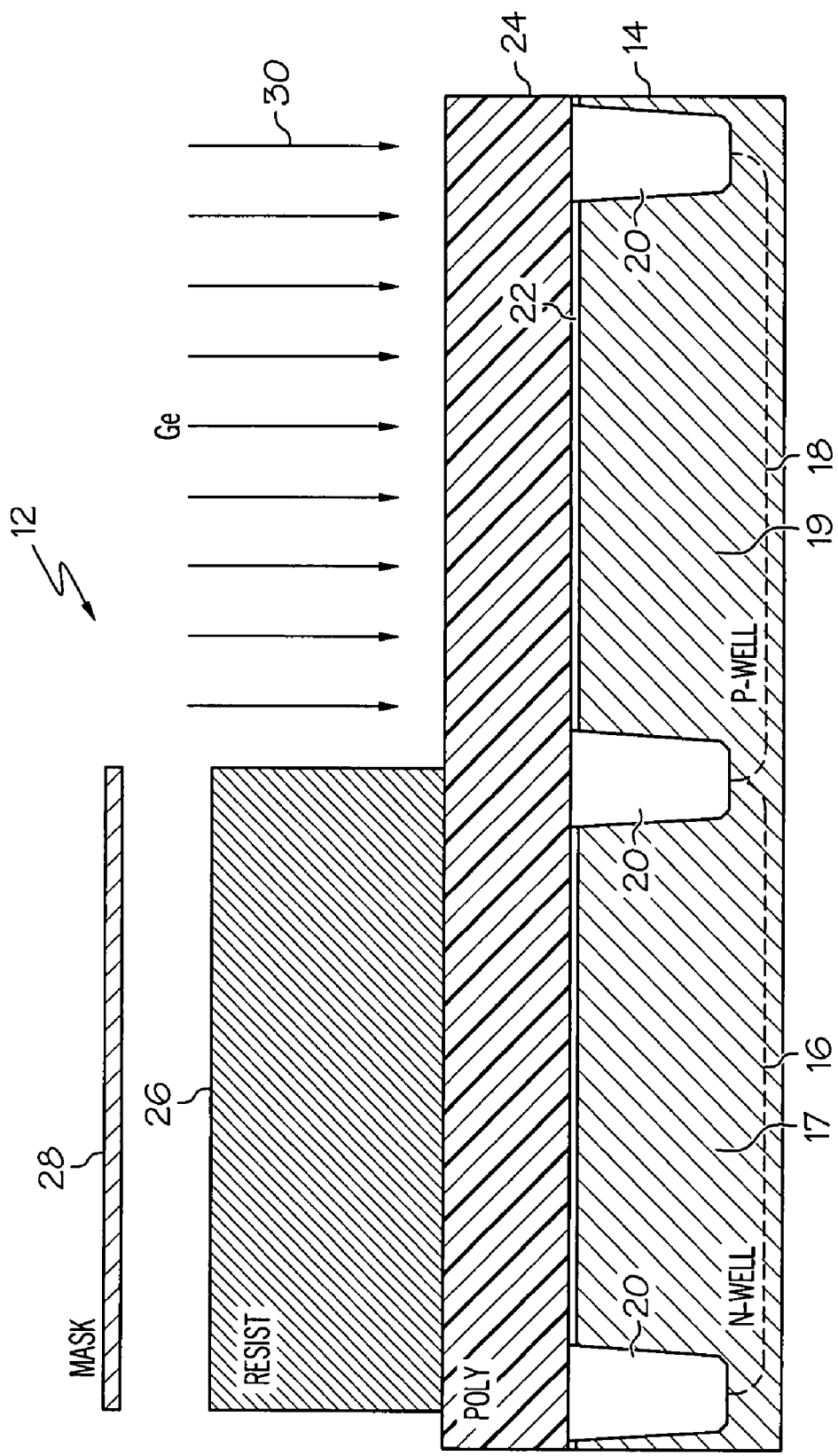

FIGS. 1a and 1b show cross-sectional views of partially fabricated CMOS transistor structures 10, 12 respectively in accordance with an embodiment of the invention. It will be appreciated that transistor structures 10, 12 may each be part of a semiconductor wafer (not shown) containing a large number of identical transistor structures, as well as other semiconductor structures.

Referring now to FIG. 1a, at this stage the transistor structure 10 may comprise a semiconductor substrate 14 having an N-well 16 and a P-well 18 separated by dielectric isolation structures 20. The region of the semiconductor substrate 14 containing the N-well 16 is the target, or PFET region 17. The region of the semiconductor substrate 14 containing the P-well 18 is the non-target or NFET region 19. When the semiconductor structure 10 is complete, as shown for example in FIG. 3a, it can be a PFET device.

A gate oxide layer 22, which may comprise silicon dioxide, may be formed overlying the semiconductor substrate 14. The gate oxide layer 22 may be formed by thermal oxidation or by chemical vapor deposition (CVD). A polysilicon layer 24 may be formed over the gate oxide layer 22, which will eventually be used to form the gate of the transistor structure 10. The polysilicon layer 24 may be deposited using, for example, a low-pressure chemical vapor deposition (LPCVD) process.

A photo resist layer 26 may be deposited over the NFET region onto the polysilicon layer 24 using conventional techniques well known in the art, such as spin-coating the photo resist, followed by the lithographic process of exposing the resist using a photo-reticle (mask) and then developing away the exposed resist. An implant mask 28 may be placed over the photo resist layer 26. The mask 28 may be made of a material suitable for blocking the ions subsequently implanted into the polysilicon layer 24 as described below.

Once the transistor structure 10 has been formed with the above-described features using conventional techniques, a poly amorphorization ion implantation step may be performed in accordance with one embodiment of the invention. In particular, in this embodiment of the invention, Ge+ ions 30 may be used for the ion implantation step. Other ions, such as Xe+, may also be used.

The Ge+ implantation on the polysilicon layer 24 may be performed using varying doses and energies depending on the desired results. For example, different doses and energies may be used for the ion implantation depending on whether the transistors being fabricated are HVT, RVT or LVT devices. In one embodiment, these different devices may be fabricated on the same wafer by using separate masking layers for the different types of devices. For example, when performing the ion implantation on the polysilicon layer 24 for an HVT device, the mask 28 may be configured to block the polysilicon layers for the non-HVT devices. In this way, the different Ge dose and energy can be applied to the polysilicon layers in the HVT, RVT and LVT devices.

The transistor structure 10 may then be processed in accordance with conventional CMOS fabrication techniques to complete the device, as described in more detail below. However, because of the ion implantation that was performed on the polysilicon layer 24 in accordance with this embodiment of the invention, when the reoxidation and source/drain anneal steps are performed, the shape of the gate formed from the polysilicon layer 24 may be altered, in particular, the gate may have expanded regions. It is this change in the shape of the gate that may induce stress in the channel region as described in more detail below.

FIG. 1b, includes the same elements as in FIG. 1a except that the mask 28 may be positioned over the PFET region 17 and the ion implantation 30 is performed on the polysilicon layer 24 over the NFET region where the gate will be formed. When the semiconductor structure 12 is complete it can be an NFET device.

Figure 2A:
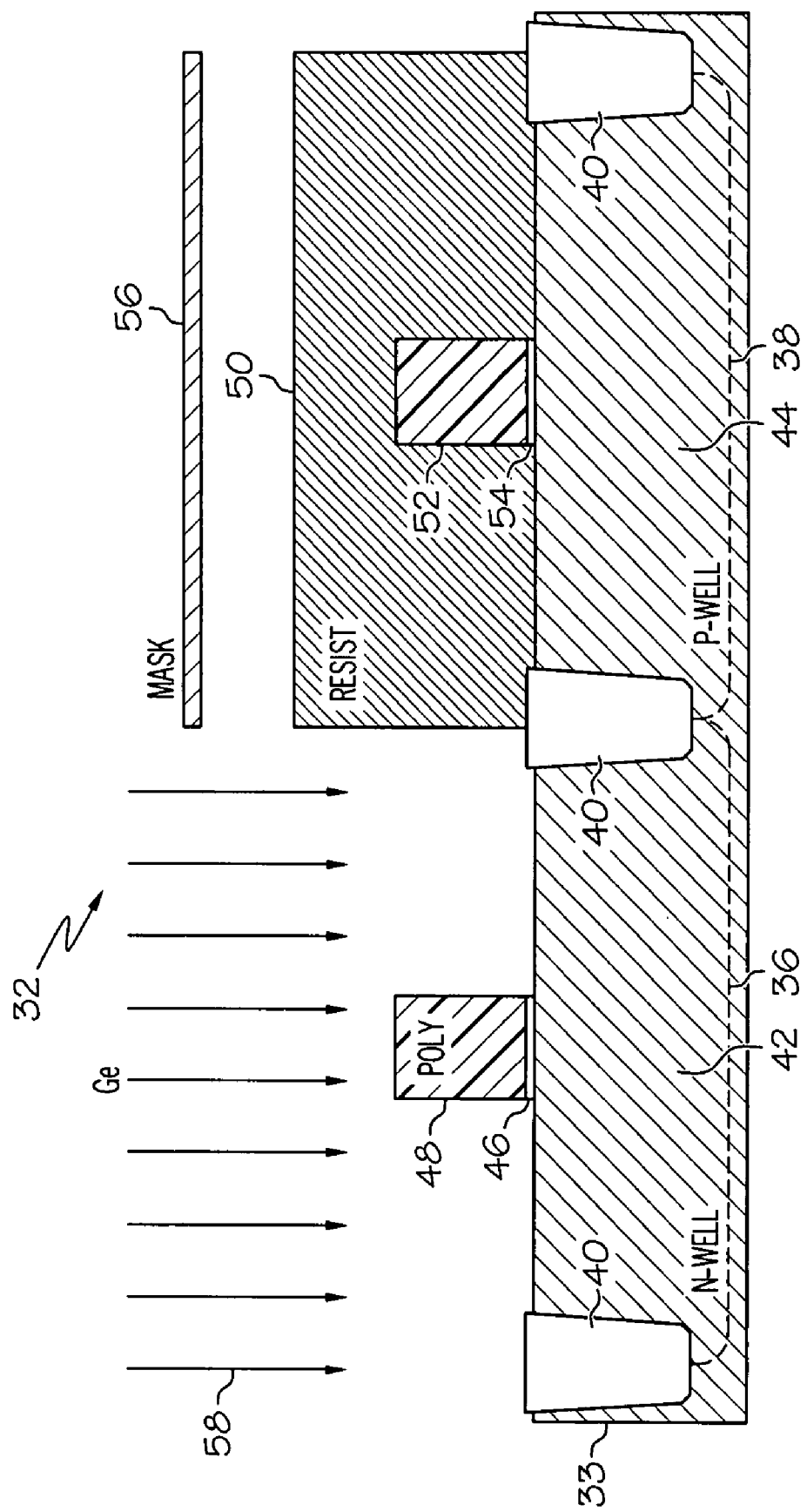
FIG. 2 shows a cross-sectional representation of a transistor fabricated according to a second embodiment of the stress modulating method of the present invention.
Figure 2B:
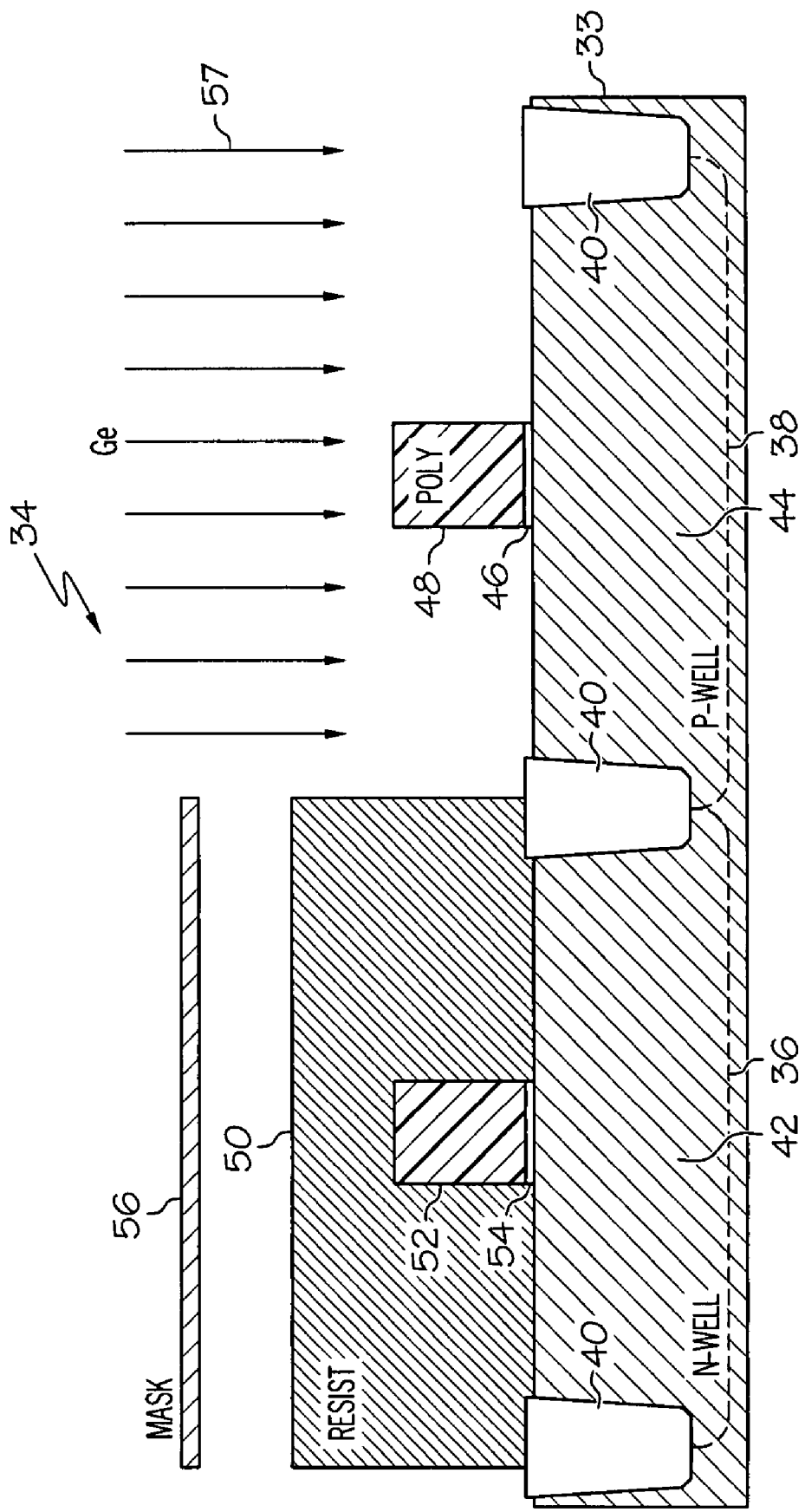

FIGS. 2a and 2b show cross-sectional views of partially fabricated CMOS transistor structures 32, 34 respectively, in accordance with another embodiment of the invention. The CMOS transistor structures 32, 34 differ from those shown in FIGS. 1a and 1b in that they are shown at a later stage of processing. Also, the poly amorphorization ion implantation of the present embodiment may be performed at a later stage than in the embodiment shown in FIGS. 1a and 1b.

Referring specifically to FIG. 2a, at this stage, the transistor structure 32 may comprise a semiconductor substrate 33 having an N-well 36 and a P-well 38 separated by dielectric isolation structures 40. The region of the semiconductor substrate 33 containing the N-well 36 is the PFET region 42. The region of the semiconductor substrate 33 containing the P-well 38 is the NFET region 44.

A gate oxide layer 46, which may comprise silicon dioxide, may be formed overlying the semiconductor substrate 33. The gate oxide layer 46 may be formed by thermal oxidation or by chemical vapor deposition (CVD). A polysilicon gate 48 may be formed by patterning a polysilicon layer that was formed over the gate oxide layer 46 using conventional techniques.

A photo resist layer 50 may be deposited over the NFET region 44 onto an area of the semiconductor substrate 33. The photo resist layer 50 may be formed over a polysilicon gate 52 formed over a gate oxide layer 54 using conventional techniques well known in the art, such as spin-coating the photo resist, followed by the lithographic process of exposing the resist using a photo-reticle (mask) and then developing away the exposed resist. An implant mask 56 may be placed over the photo resist layer 50. The mask 56 may be made of a material suitable for blocking the ions subsequently implanted into the polysilicon gate 48, as described below.

Once the transistor structure 32 has been formed with the above-described features using conventional techniques, a poly amorphorization ion implantation step may be performed in accordance with this embodiment of the invention. In particular, Ge+ ions 58 may be used for the ion implantation step. Other ions may also be used. As discussed above in connection with the embodiments shown in FIGS. 1a and 1b, when subsequent processing takes place, the shape of the polysilicon gate 52 may change, for example by expanding laterally in certain regions resulting in stress in the channel region as described in more detail below. Also, in a similar manner as described along with the embodiments shown in FIGS. 1a and 1b, the Ge implantation may be performed using varying doses and energies to cause expansion of the polysilicon gate 52 and thereby modulate the stress in the channel.

FIG. 2b, includes the same elements as in FIG. 2a except that the mask 56 may be positioned over the PFET region 42 and the ion implantation 58 may be performed on the polysilicon gate 48 over the NFET region. When the semiconductor structure 34 is complete it can be an NFET device.

Figure 3A:
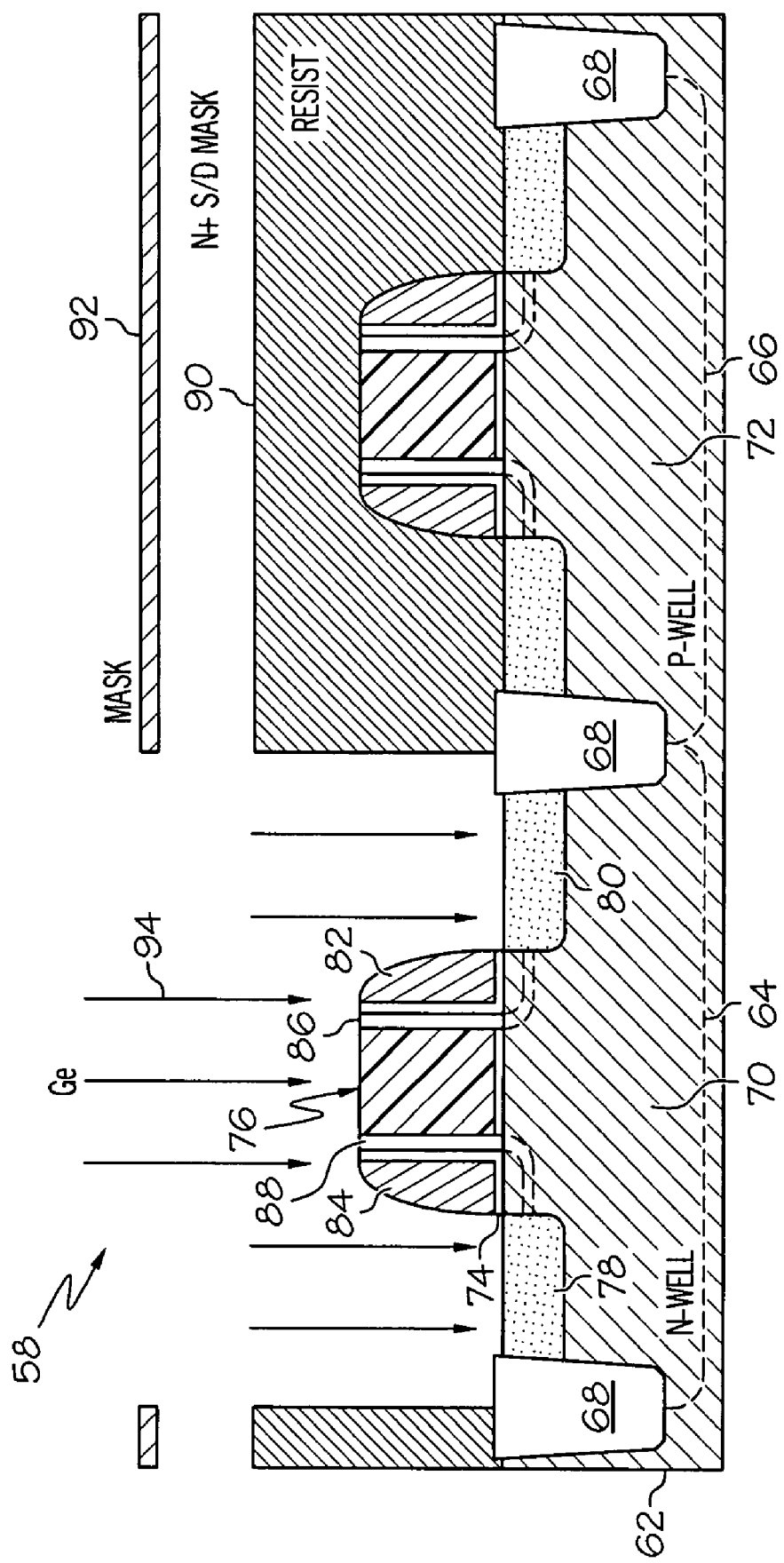
FIG. 3 shows a cross-sectional representation of a transistor fabricated according to a third embodiment of the stress modulating method of the present invention.
Figure 3B:
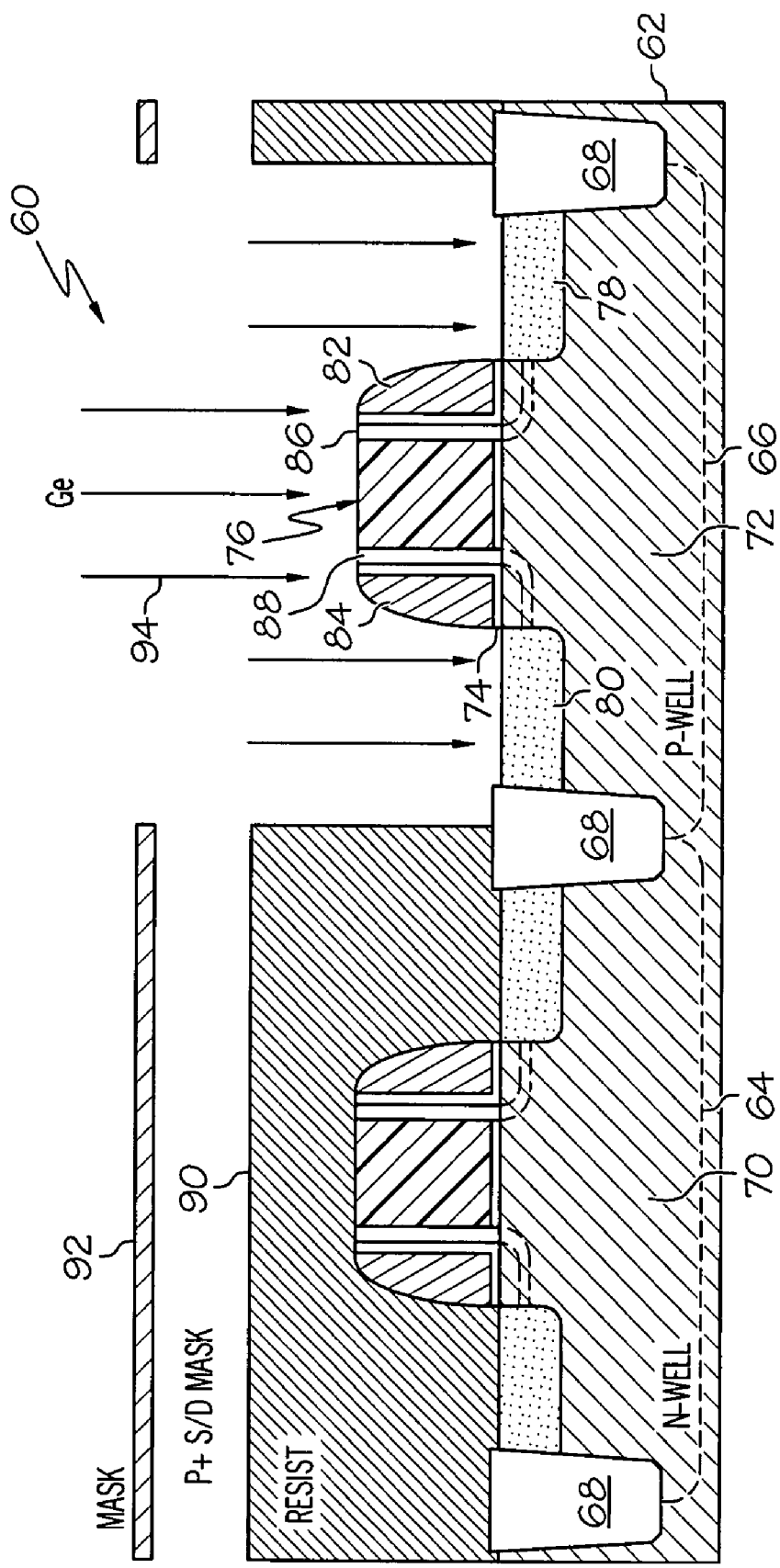

FIGS. 3a and 3b show cross-sectional views of partially fabricated CMOS transistor structures 58 and 60 respectively in accordance with another embodiment of the invention. The CMOS transistor structures 58, 60 differ from those shown in FIGS. 2a and 2b in that they are shown at a later stage of processing and the poly amorphorization ion implantation of the present invention may be performed at a later stage than in the embodiment shown in FIGS. 2a and 2b.

Referring specifically to FIG. 3a, at this stage, the transistor structure 58 may comprise a semiconductor substrate 62 having an N-well 64 and a P-well 66 separated by dielectric isolation structures 68. The region of the semiconductor substrate 58 containing the N-well 64 is the PFET region 70. The region of the semiconductor substrate 58 containing the P-well 66 is the NFET region 72.

A gate oxide layer 74, which may comprise silicon dioxide, may be formed overlying the semiconductor substrate 58. Two polysilicon gates 76 may be formed by patterning a polysilicon layer that was formed over the gate oxide layer 74 using conventional techniques. The two polysilicon gates 76 may be formed over the PFET region 70 and over the NFET region 72.

Source 78 and drain 80 regions may have been formed in the PFET and NFET regions 70, 72 using conventional techniques. Conventional sidewall spacers 82, 84 along with conventional sidewall liners 86, 88 may be formed on each side of both polysilicon gates 76.

A photo resist layer 90 may be deposited over the NFET region 72 onto an area of the semiconductor substrate 33 covering the polysilicon gate 76 disposed over the NFET region 72 using conventional techniques well known in the art. A mask 92 may be placed over the photo resist layer 50. The mask 92 may be made of a material suitable for blocking the ions subsequently implanted into the polysilicon gate 48 as described below.

Once the transistor structure 58 has been formed with the above-described features using conventional techniques, a poly amorphorization ion implantation step may be performed in accordance with this embodiment of the invention. In particular, Ge$^+$ ions 94 may be used for the ion implantation step. Other ions may also be used. As discussed above with regards to the embodiments shown in FIGS. 2a and 2b, when subsequent annealing processing takes place, the shape of the polysilicon gate 76 may change, for example by expanding laterally in certain regions resulting in stress in the channel region as described in more detail below. Also, in a similar manner as described along with the embodiments shown in FIGS. 2a and 2b, the Ge implantation may be performed using varying doses and energies followed by subsequent annealing process(es) to modify the shape of the polysilicon gate 76 and thereby modulate the stress in the channel.

Figure 4:
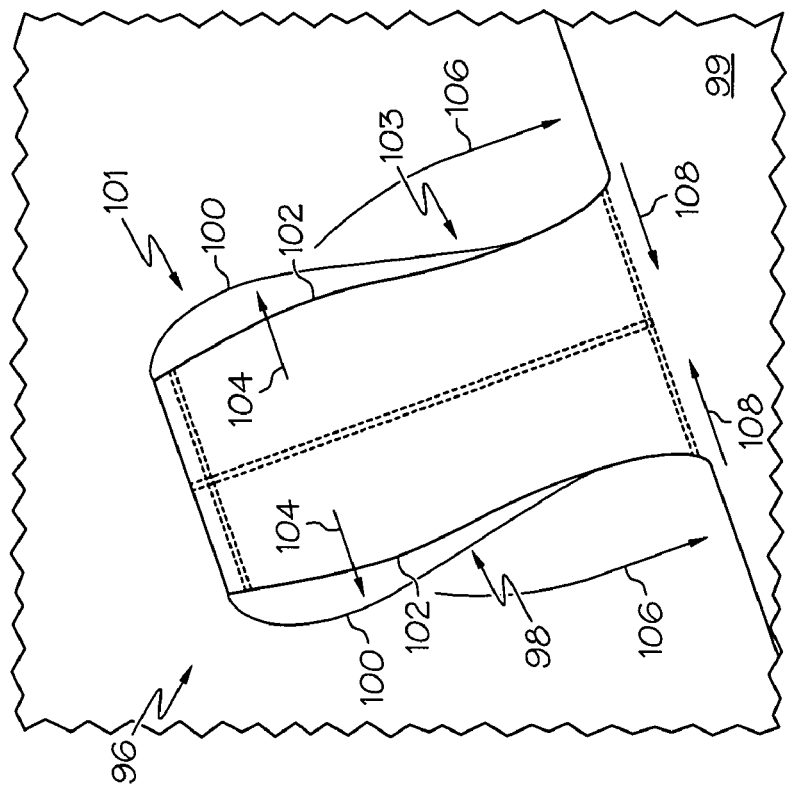
FIG. 4 is a micrograph of a cross-section of a PFET transistor gate showing the effect of the stress modulation method of the present invention.

FIG. 3b, includes the same elements as in FIG. 3a except that the mask 92 may be positioned over the PFET region 70 and the ion implantation 94 may be performed on the polysilicon gate 76 over the NFET region 72. When the semiconductor structure 60 is complete it can be an NFET device FIG. 4 shows a tunneling electron microscope (TEM) image 96 of a cross-section of a PFET polysilicon gate 98 showing the effect of the stress modulation technique of the present invention. In particular, when processing the transistor structures according to the present invention as shown in FIGS. 1a, 2a, and 3a, the resulting PFET device may have a polysilicon gate 98 disposed on a semiconductor substrate 99 with its shape modified as shown in FIG. 4. Contour 100 shows that the side edges of the polysilicon gate 98 with the Ge ion implantation performed on it may have expanded in an upper portion 101 after subsequent source/drain anneal in accordance with the present invention. Contour 102 shows that the side edges of the polysilicon gate 98 without the Ge ion implantation performed on it remains flat in both the upper portion 101 and a lower portion 103. The bulging of the sides caused by the Ge ion implantation and subsequent anneal, may cause increased residual compressive stress in the transistor channel (not shown) within the semiconductor substrate 99. The bulge in the polysilicon gate is due to localized expansion of the polysilicon gate during the recrystallization process that occurs during annealing as the implanted Ge ions that are larger than the Si atoms attempts to fit into the Si lattice. This bulging is primarily near the top of the polysilicon gate 98 because the peak of the implanted Ge ions is located near the top of the PFET polysilicon gate. Diagrammatic lines illustrating the forces causing this stress are also illustrated in FIG. 4. In particular, lines 104 show the outward lateral forces on the adjacent spacer (not shown), lines 106 show the downward vertical forces, and lines 108 show the inward lateral forces exerted in the channel within the semiconductor substrate 99.

Figure 5:
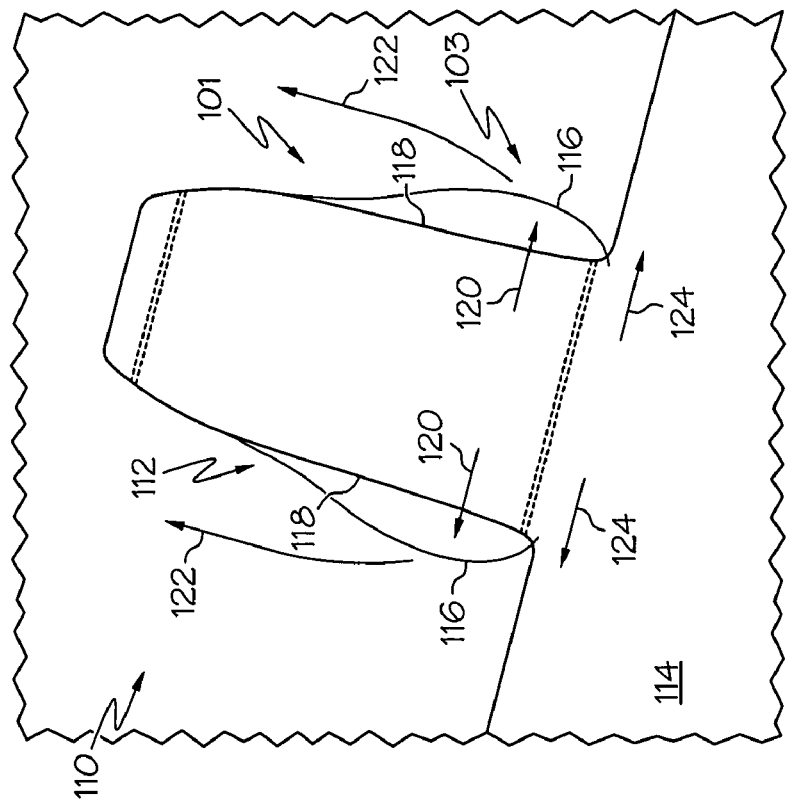
FIG. 5 is a micrograph of a cross-section of an NFET transistor gate showing the effect of the stress modulation method of the present invention.

FIG. 5 shows a tunneling electron microscope (TEM) image 110 of a cross-section of an NFET polysilicon gate 112 showing the effect of the stress modulation technique of the present invention. In particular, when processing the transistor structures according to the present invention as shown in FIGS. 1b, 2b, and 3b, the resulting NFET device may have a polysilicon gate 112 disposed on a semiconductor substrate 114 with its shape modified as shown in FIG. 5. Contour 116 shows that the side edges of the polysilicon gate 112 with the Ge ion implantation performed on it may have expanded in the lower portion 103 after subsequent source/drain anneal in accordance with the present invention. Contour 118 shows that the side edges of the polysilicon gate 112 without the Ge ion implantation performed on it remain flat in upper and lower portions 101, 103. The bulging of the sides caused by the Ge ion implantation and subsequent anneal, may cause increased residual tensile stress in the transistor channel (not shown) within the semiconductor substrate 114. In particular, this bulging may be primarily near the bottom of the polysilicon gate 112 because the peak of the implanted Ge ions is located near the bottom of the NFET polysilicon gate. Diagramatic lines illustrating the forces causing this stress are also illustrated in FIG. 5. Lines 120 show the outward lateral forces on the adjacent spacer (not shown), lines 122 show the upward vertical forces, and lines 124 show the outward lateral forces exerted in the channel within the semiconductor substrate 114.

Figure 6:
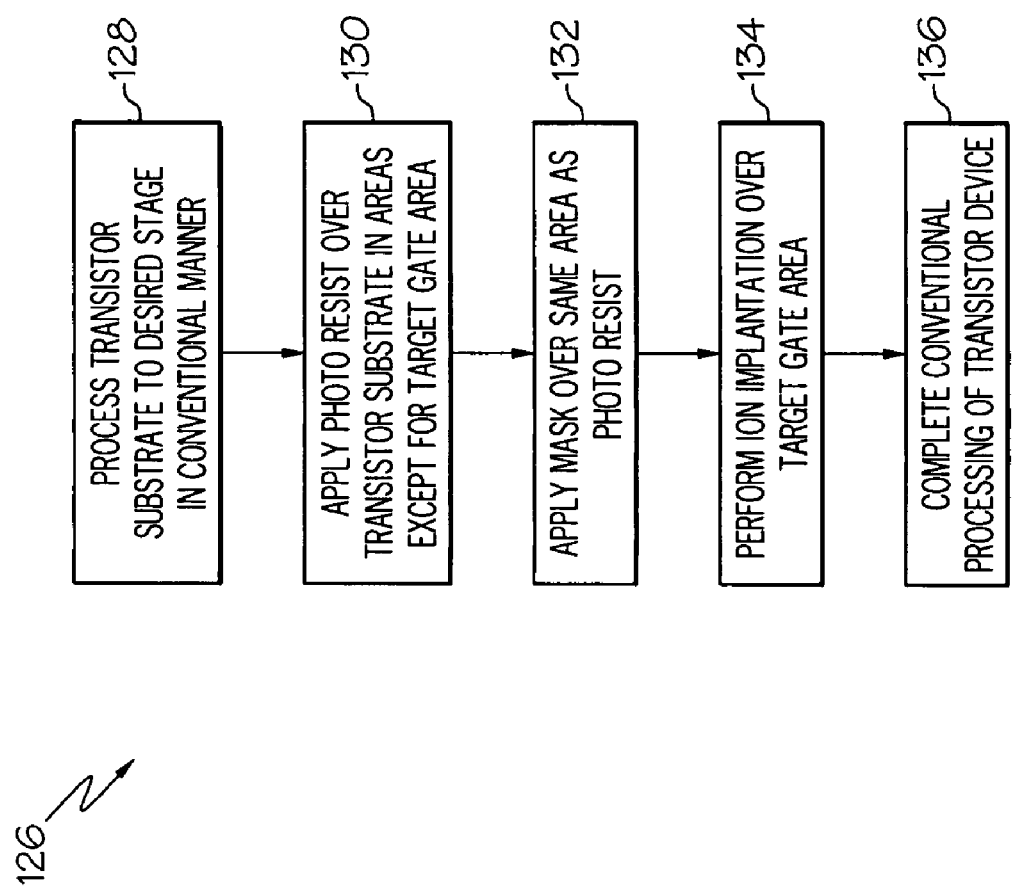
FIG. 6 shows a flow chart of a method of modulating the stress in a transistor in accordance with an embodiment of the invention.

FIG. 6 shows a flow chart of a process 126 of modulating spacer induced stress in accordance with one embodiment of the invention. Process 126 begins with the conventional processing of a semiconductor substrate to a desired stage in step 128. For example, the processing may be up to the stage as shown in FIGS. 1a, 1b, or FIGS. 2a, 2b or FIGS. 3a, 3b. A photo resist layer may be applied over the transistor substrate in areas except where the target gate to be ion implanted is located as shown in step 130. For example, this may comprise photo resist 26, 50 or 90 discussed above. In step 132 a mask may be applied over the same area as the photo resist. This may comprise, for example, mask 28, 56 or 92 discussed above. Ion implantation, step 134, may then be performed to the target gate area, such as ion implantation 30, 58 or 94 discussed above. In step 136 the processing of the transistor device may be completed in a conventional manner.

Thus, it may be seen that the present invention may provide a method of modulating spacer induced stress by ion implanting the polysilicon gate. The resultant change in the shape of the gate may induce stress on the spacers, which in turn may increase stress in the channel to enhance carrier mobility. The technique is simple and can be separately implanted to HVT, RVT and LVT devices to suitably and independently modify the polysilicon gate profile to obtain the desired device performance and enhancement.

It should be understood, of course, that the foregoing relates to exemplary embodiments of the invention and that modifications may be made without departing from the spirit and scope of the invention as set forth in the following claims.

We claim:

1. A method of forming a semiconductor device comprising:
    providing a substrate defined with a first transistor region for a first transistor of a first type and a second transistor region for a second transistor of a second type, the substrate is prepared with
        a first gate of the first transistor being disposed in the first region, and
        a second gate of the second transistor being disposed in the second region;
    selectively preparing the first gate with first ions at a first target region which is less than a total thickness of the first gate;
    selectively preparing the second gate with second ions at a second target region which is less than a total thickness of the second gate, wherein the first target region is in a different portion of the gate than the second target region; and
    annealing the substrate, wherein annealing causes the first target region of the first gate and the second target region of the second gate to expand.

2. The method of claim 1 wherein the first target region is in a lower portion of the first gate.

3. The method of claim 2 wherein the first transistor is a n-type transistor and the first stress is a tensile stress.

4. The method of claim 1 wherein the first target region is in an upper portion of the gate.

5. The method of claim 4 wherein the first transistor is a p-type transistor and the first stress is a compressive stress.

6. The method of claim 1 wherein the first ions comprise Ge or Xe or a combination thereof.

7. The method of claim 1
    wherein annealing the substrate causes the second target region of the second gate to expand to cause a channel of the second transistor in the substrate under the second gate to have a second stress to improve dopant mobility of the second transistor.

8. The method of claim 7 wherein:
    the first target region is in a lower portion of the first gate; and
    the second target region is in an upper portion of the gate.

9. The method of claim 8 wherein:
    the first transistor is a n-type transistor and the first stress is a tensile stress; and
    the second transistor is a p-type transistor and the second stress is a compressive stress.

10. The method of claim 7 wherein the first and second ions comprise Ge or Xe or a combination thereof.

11. The method of claim 10 wherein the first and second ions comprise the same type of ions.

12. A method of forming a semiconductor device comprising:
    applying an ion implantation to a target gate region of a gate electrode layer on a substrate;
    annealing the substrate, wherein said target gate region of a gate of a transistor is expanded due to said ion implantation; and
    completing the fabrication of the semiconductor device on said semiconductor substrate, wherein said expansion of said gate causes a stress to be applied to a channel of the transistor under the gate,
        wherein the transistor is a n-type transistor and said gate has sidewalls having a lower portion and said annealing comprises increasing the distance between said sidewalls at said lower portion of said gate.

13. The method of claim 12 further comprising applying upward forces on the substrate adjacent to said gate.

14. A method of forming a semiconductor device comprising:
    providing a substrate, the substrate includes a first transistor region for a first transistor of a first type and a second transistor region for a second transistor of a second type, the substrate is prepared with
        a first gate of the first transistor being disposed in the first region, and
        a second gate of the second transistor being disposed in the second region;
    selectively preparing the first gate and not the second gate with first ions at a first target region which is less than a total thickness of the first gate;
    selectively preparing the second gate and not the first gate with second ions at a second target region which is less than a total thickness of the second gate, wherein the first target region is in a different portion of the gate than the second target region;
    annealing the substrate, wherein annealing causes
        the first target region of the first gate to expand to cause a channel of the first transistor in the substrate under the first gate to have a first stress to improve dopant mobility of the first transistor, and
        the second target region of the second gate to expand to cause a channel of the second transistor in the substrate under the second gate to have a second stress to improve dopant mobility of the second transistor.

15. The method of claim 14 wherein the first and second ions are provided in the first and second target regions of the first and second gates prior to patterning of a gate electrode layer to form the first and second gates.

16. The method of claim 15 wherein:
    the first target region comprises a lower portion of the first gate; and
    the second target region comprises an upper portion of the second gate.

17. The method of claim 14 wherein the first and second ions are provided in the first and second target regions of the first and second gates after patterning a gate electrode layer to form the first and second gates.

18. The method of claim 17 wherein:
    the first target region comprises a lower portion of the first gate; and
    the second target region comprises an upper portion of the second gate.

19. The method of claim 14 wherein:
    the first target region comprises a lower portion of the first gate; and the second target region comprises an upper portion of the second gate.

20. The method of claim 19 wherein:
the first target region comprises a lower portion of the first gate;
the first stress comprises a tensile stress;
the second target region comprises an upper portion of the second gate; and
the second stress comprises a compressive stress.

21. The method of claim 20 wherein:
the first type comprises n-type; and
the second type comprises p-type.

22. The method of claim 19 wherein the first ions comprise Ge or Xe or a combination thereof.

23. The method of claim 19 where the second ions comprise Ge or Xe or a combination thereof.

24. The method of claim 19 wherein the first and second ions comprise the same ions.

* * * * *